United States Patent
Sacherman et al.

[19]

[11] Patent Number: 5,973,926

[45] Date of Patent: Oct. 26, 1999

[54] METHOD AND APPARATUS FOR ATTACHING CIRCUIT BOARD TO CHASSIS AND FORMING SOLID GROUND CONNECTION USING A SINGLE SCREW

[75] Inventors: Jim Sacherman; John Toor, both of Palo Alto, Calif.

[73] Assignee: Palo Alto Design Group, Inc., Palo Alto, Calif.

[21] Appl. No.: 08/607,963

[22] Filed: Feb. 29, 1996

[51] Int. Cl.[6] .................................................. H05K 5/00
[52] U.S. Cl. ...................... 361/759; 361/740; 361/741; 361/742; 361/747; 361/753; 361/758; 361/799; 361/801; 361/802
[58] Field of Search ..................................... 361/726, 732, 361/735, 736, 737, 740–742, 747, 748, 752, 753, 758, 759, 784, 790, 791, 799, 796, 801, 802, 803, 804, 770, 772, 774, 818, 825, 807, 809; 235/487, 492; 439/946, 64, 76.1, 325, 327; 174/35 R, 35 GC

[56] References Cited

U.S. PATENT DOCUMENTS 5,535,098  7/1996  Jakob et al. ............................ 361/752

*Primary Examiner*—Leo P. Picard
*Assistant Examiner*—Phuong T. Vu
*Attorney, Agent, or Firm*—Haverstock & Owens LLP

[57] ABSTRACT

A method and apparatus for mounting a motherboard to a chassis of a personal computer using only a single screw. A number of standoffs snap into the base of the chassis, electrically contacting the chassis. Each standoff includes a projection. The motherboard includes apertures for accepting the projections such that when an ramp and shelf of each projection is aligned with the motherboard, the motherboard is positioned a fixed distance from the chassis. A mounting bracket also includes a number of projections. Apertures provided in the motherboard correspond to the projections of the mounting bracket. The surface of each side of the motherboard surrounding each aperture is plated with an electrically conductive material to form a conductive path between the motherboard and the standoffs and the bracket. The projections of the bracket are inserted into the corresponding apertures in the motherboard. A screw is inserted through a wall of the chassis and into a threaded hole in the bracket. As the screw is tightened, the bracket is drawn toward the wall of the chassis. This firmly engages the motherboard to the stand-offs and to the bracket, firmly maintaining the motherboard in a fixed position relative to the chassis and forming a solid electrical ground connection between the motherboard and the chassis. Also, as the screw is tightened, input and output connectors, which are coupled to the motherboard, are drawn toward the wall of the chassis making firm contact with a plate or gasket.

34 Claims, 3 Drawing Sheets

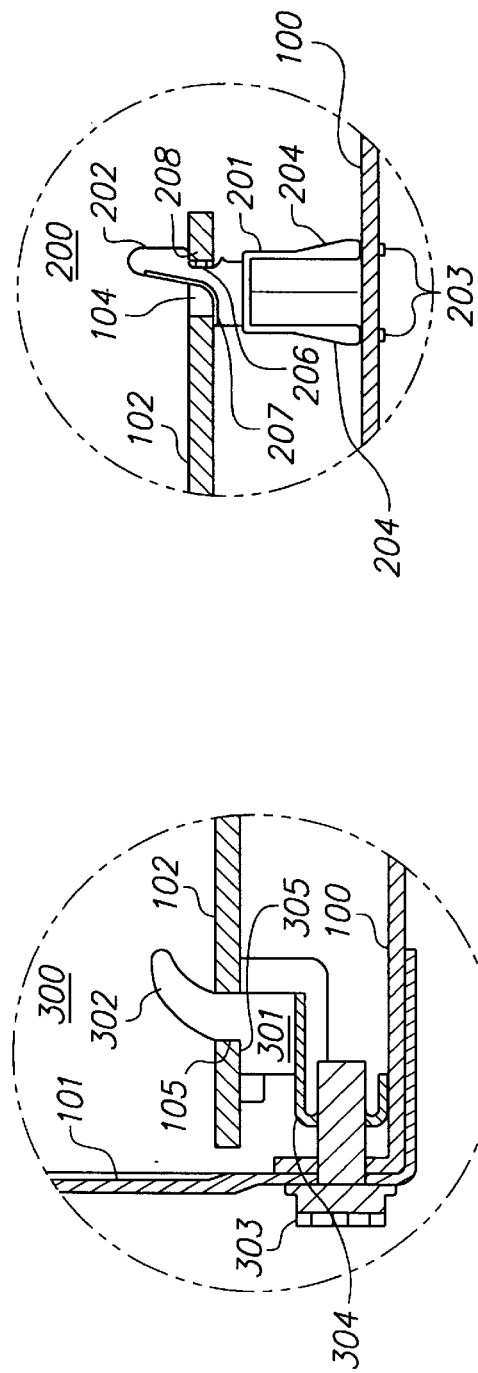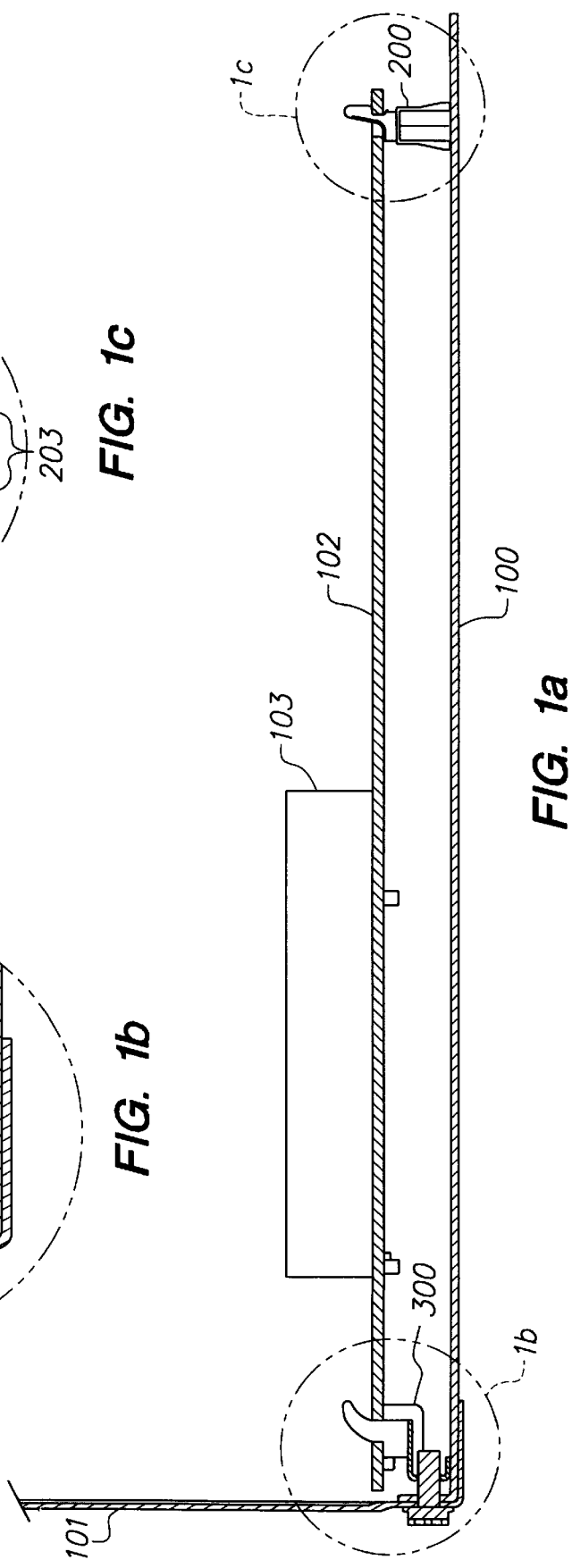

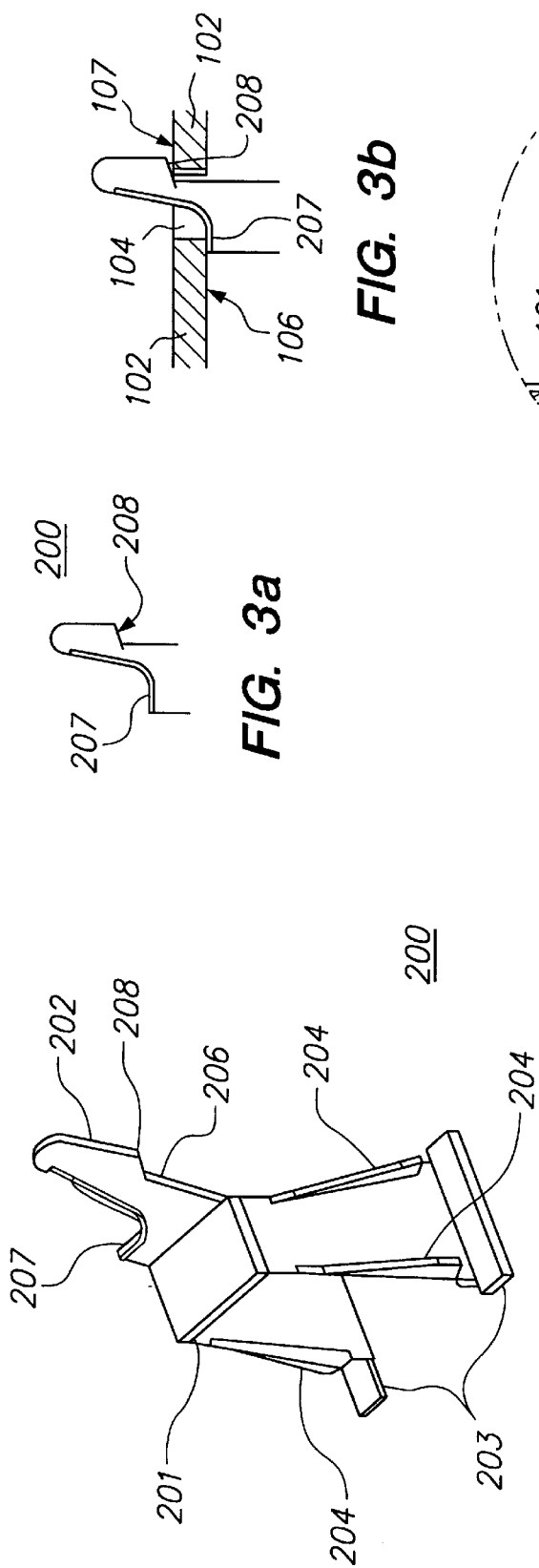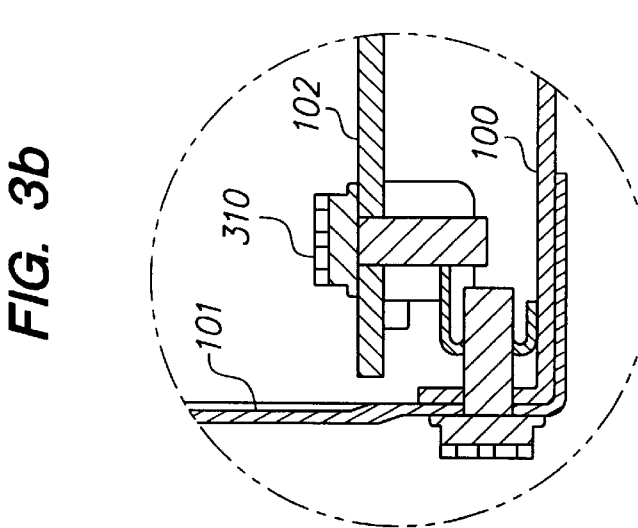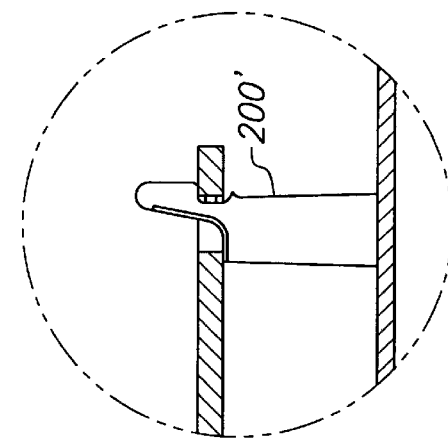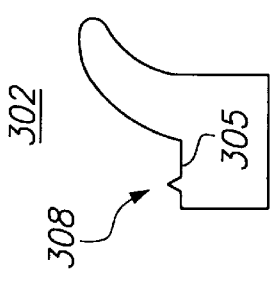

METHOD AND APPARATUS FOR ATTACHING CIRCUIT BOARD TO CHASSIS AND FORMING SOLID GROUND CONNECTION USING A SINGLE SCREW

FIELD OF THE INVENTION

This invention relates to the field of attaching a circuit board to a computer system chassis. More particularly, this invention relates to the field of attaching a circuit board to a computer system chassis forming a solid electrical ground connection between the circuit board and the chassis and forming a mechanical attachment of the circuit board to the chassis while using a minimum number of screws.

BACKGROUND OF THE INVENTION

Commercially available personal computer systems include a printed circuit board known as the motherboard. The motherboard contains the central processing unit for the personal computer, general control circuits, input and output connectors and also includes card slots or edge connectors for attaching various expansion cards.

Conventional personal computer systems also include a system chassis. The system chassis provides a mechanical structure for the personal computer. Various components of a personal computer system, such as a floppy disk drive, a hard disk drive, an optical disk drive, a cooling fan, a power supply and the motherboard are all attached to the system chassis.

Generally, the system chassis forms an enclosure, the interior surface of which is metallic to provide governmentally required electromagnetic shielding. This shielding prevents electromagnetic energy produced by the personal computer system from escaping the chassis where it can interfere with other electronic devices located near the personal computer system. Such shielding may also improve the performance of the personal computer system by preventing environmental electromagnetic energy from entering the enclosure and interfering with circuits of the personal computer system located therein.

The motherboard is typically mounted to the system chassis using standoffs. A conventional standoff is a piece of sheet metal folded into a U-shape which is inserted into a rectangular opening cut into a base of the chassis. A threaded hole is formed in the base of the U-shape and a screw is passed through a aperture in the motherboard and secured to the standoff through the threaded hole. Other conventional standoffs include pressed in studs or may be formed by stamping and folding the system chassis.

The standoffs prevent electrical contact between this electromagnetic shielding and exposed electrically active circuitry on the motherboard, such as printed traces, solder bonds, jumper wires and the like. The standoffs prevent such contact by positioning the motherboard at a fixed distance from the chassis. In addition, the insertion into and removal of expansion cards from the motherboard can apply significant forces to the motherboard which may tend to dislodge the motherboard from the chassis. Therefore, the standoffs must be able to resist such forces.

In addition to mechanically positioning the motherboard, the standoffs and screws provide an electrically conductive path between the system chassis and a ground plane or ground node on the motherboard. A solid, low impedance connection to ground is important to ensure the reliability of the computer system. For example, a low impedance ground connection helps suppress electromagnetic interference. For this purpose, a portion of the motherboard surrounding each mounting aperture is plated with an electrically conductive material. Less commonly, the interior of each mounting aperture may also be plated. An electrical connection is then established between the plating material and the standoff when the screw is tightened.

Personal computers are typically manufactured on a large scale wherein small reductions in per-unit cost can aggregate to a significant amount of savings or increased profit. Conventional methods for mounting a motherboard to the system chassis generally utilize from five to eight screws for each motherboard. It is well known that using screws adds time and expense to a manufacturing process. For example, the motherboard must be properly aligned with the screw holes, any lock washers must be applied to the screws, then the screws are typically applied and loosely threaded into the accepting screw holes, and finally, once all the screws are in place, the several screws are tightened. This repetitive and recursive process is difficult to automate and thus requires significant human labor. In addition, screws can add to product quality problems as incorrect installation can cause damage to the motherboard or screws may be forgotten. Therefore, a technique is needed for mounting the motherboard of a personal computer system to the chassis of the personal computer system that uses a minimum number of screws. Such a technique should provide a solid electrical ground connection between the motherboard and the chassis and should provide a secure mechanical attachment of the motherboard to the chassis that is able to resist forces associated with insertion and removal of expansion cards.

Further, the input and output connectors which are mounted to the motherboard must be accessible from the exterior of the personal computer system. An opening is therefore provided in the chassis for such access. This opening may, however, reduce the effectiveness of the electromagnetic shielding. Conventional personal computer systems provide a gasket to fill gaps between the input and output connectors and the system chassis or between the input and output connectors and a trim panel of a computer case that is exterior to the chassis. To form an effective electromagnetic shield, however, this gasket must firmly contact the chassis or trim panel and the input and output connectors. Therefore, what is further needed is a means for ensuring firm contact between a gasket surrounding the input and output connectors and the chassis or trim panel of a personal computer system.

SUMMARY OF THE INVENTION

The invention is a method and apparatus for mounting a motherboard of a personal computer system to a chassis of the personal computer system. Preferably, the motherboard conforms to industry standards and requires no special modifications for use with the invention. A number of standoffs are snap mounted into the base of the chassis or are integrally formed with the base of the chassis such that the standoffs are in intimate electrical contact with the chassis. Each standoff includes a first projecting member which extends away from the chassis. Each projecting member includes an indentation having a ramped portion. The motherboard includes a first set of apertures for accepting the projecting members such that when the indentation and ramped portion each projecting member is aligned with its corresponding aperture in the motherboard, the motherboard is positioned a fixed distance from the chassis. The area of the motherboard surrounding each aperture in the motherboard is plated with an electrically conductive material to form a conductive path between the motherboard and the chassis.

A mounting bracket also includes a number of second projecting members. A second set of apertures is provided in the motherboard corresponding to the projecting members of the mounting bracket. The surface on each side of the motherboard surrounding each second aperture is also plated. The projecting members are simultaneously inserted into the corresponding apertures in the motherboard. A screw is inserted through a wall of the chassis and into a threaded hole in the bracket. As the screw is tightened, the bracket is drawn toward the wall of the chassis. This action cams the second projecting members into the second set of apertures to firmly engage the motherboard to the bracket and to make solid electrical contact between the plated portions the motherboard and the bracket. This action also draws the motherboard to the chassis wall which firmly engages the motherboard to all of the first projecting members. Once the screw is fully engaged, the projecting members of the stand-offs and the projecting members of the bracket are resiliently held against the walls of the apertures and the plated surfaces of the motherboard, firmly maintaining the motherboard in a fixed position relative to the chassis and forming a solid electrical ground connection between the motherboard and the chassis.

A gasket is positioned between the input and output connectors and the chassis or between the input and output connectors and a trim panel of a computer case. As the screw is tightened, input and output connectors, which are coupled to the motherboard, are drawn toward the wall of the chassis making firm contact with the gasket. Thus, the integrity of the electromagnetic shielding is preserved.

Thus, the invention allows the motherboard to be secured to the chassis using only a single screw.

BRIEF DESCRIPTION OF THE DRAWINGS

FIG. 1 shows a side view of a preferred embodiment of the invention assembled to a motherboard including an expanded side view of the mounting bracket assembly and an expanded side view of a standoff.

FIG. 2 shows a perspective view of a standoff.

FIG. 3 shows a side view of a standoff including detail of points of contact with the motherboard.

FIG. 4 shows a side view of a projecting member of the bracket assembly including detail of a bump for contacting conductive plating on the motherboard.

FIG. 6 illustrates a standoff integrally formed with the chassis.

FIG. 7 illustrates a threaded fastener which can replace a projecting member of the bracket illustrated in FIG. 1.

DETAILED DESCRIPTION OF THE PREFERRED EMBODIMENT

Figure 5:
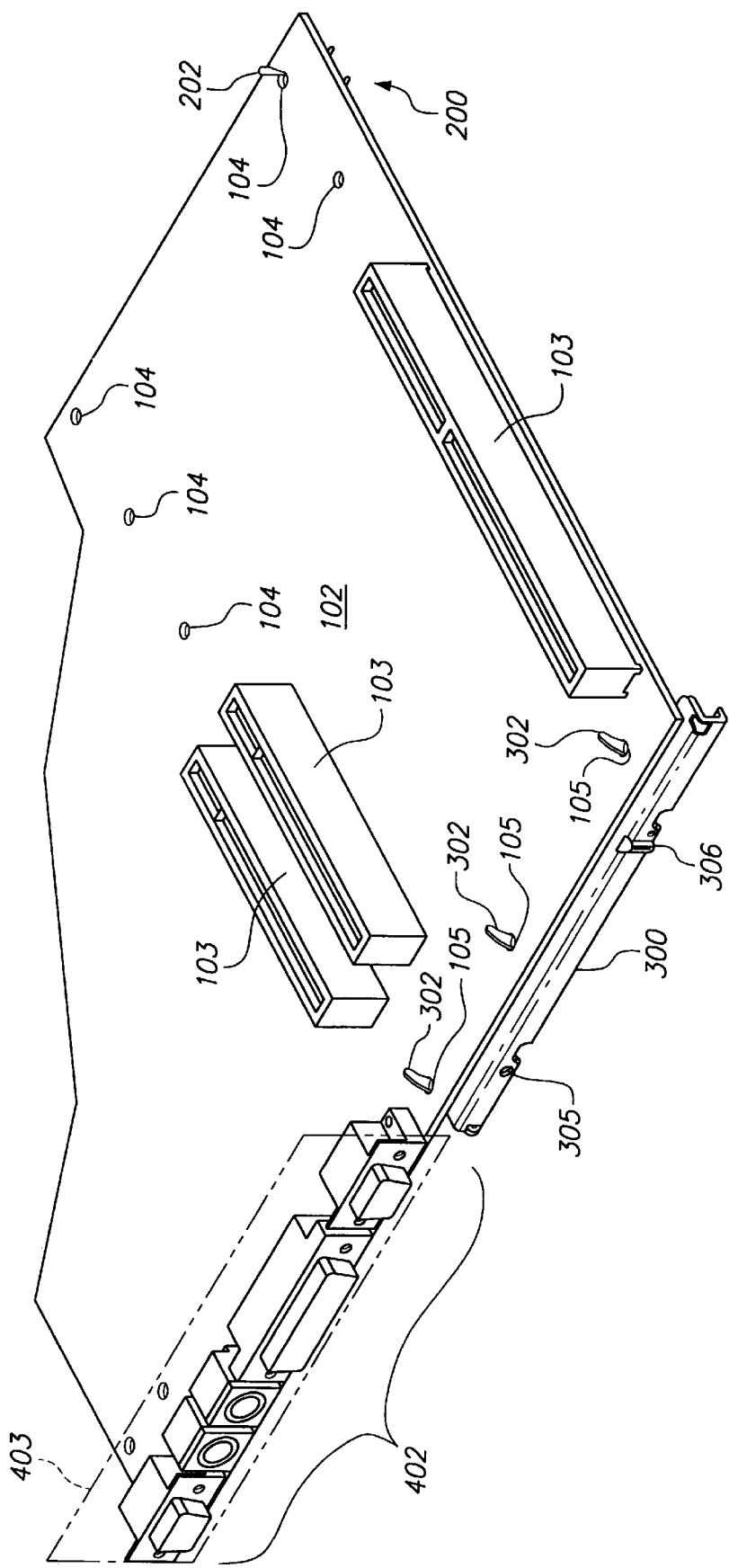
FIG. 5 shows a perspective view of a standoff, the mounting bracket assembly and a motherboard.

FIG. 1 shows a side view of a preferred embodiment of the invention assembled to a motherboard 102 including an expanded side view of the bracket assembly 300 and an expanded side view of a standoff 200. A personal computer system chassis includes a chassis base 100 which is coupled to a chassis rear wall 101. Preferably, the chassis also includes sides, a front, and a top (all not shown), to form an enclosure which surrounds components of the personal computer system. In addition, the chassis preferably is formed of sheet metal, or formed of some other material, such as plastic, that is coated or clad with an electrically conductive material, for forming an electromagnetic shield around the components of the personal computer.

The motherboard 102 of the personal computer system is attached to the chassis base 100 by a standoff 200. A single standoff 200 is shown, but as will be apparent, any number of standoffs could be utilized. The motherboard 102 is also attached to the chassis rear wall 101 by a bracket assembly 300. The motherboard 102 contains the central processing unit for the personal computer (not shown), general control circuits (not shown), input and output connectors 402 (FIG. 5), and also includes card slots/edge connectors 103 for attaching various expansion boards to the motherboard 102.

An expanded portion of FIG. 1 shows a standoff 200 in greater detail. In addition, FIG. 2 shows a perspective view of a standoff 200 and FIG. 3 shows a side view of a standoff 200. Each standoff 200 comprises a resilient U-shaped base portion 201, a hook-shaped first projecting member 202, clips 203 and wings 204. Each first projecting member 202 includes a notch or indentation 206, a shelf 207, and a ramped portion 208. The standoffs 200 are preferably electrically conductive and formed of sheet metal, but could be formed of any suitable material.

Each standoff 200 is installed to the chassis by inserting the standoff 200 through a rectangular opening in the chassis base 100 from a side of the chassis base 100 opposite the motherboard 10 (see e.g. U.S. patent application Ser. No. 08/555,518, filed Nov. 8, 1995). Preferably, all the features of the standoffs 200 are integrally formed from a single stamped sheet metal blank. As the standoff 200 is inserted into the rectangular opening, the wings 204 press against the interior of the rectangular opening causing the U-shaped base portion 201 to resiliently become more narrow to fit into the rectangular opening. Once the standoff 200 is inserted into the rectangular opening far enough to clear the wings 204, the U-shaped base portion 201 resiliently expands, snapping into place. Once the standoff 200 is snapped into place, the clips 203 prevent the standoff 200 from being able to pass through the rectangular opening, while the wings 204 attached to the U-shaped base portion 201 prevent the standoff 200 from backing out of the rectangular opening. Alternatively, the standoffs 200 may be integrally formed with the chassis by stamping and folding the chassis base 100 to form each standoff 200 as illustrated in FIG. 6 by the standoff 200.

The motherboard 102 is attached to the standoffs 200 by inserting the first projecting member(s) 202 into corresponding apertures 104 in the motherboard 102. Only one aperture 104 is shown in FIG. 1, however, FIG. 5 shows several such apertures 104. It will be apparent that any number of such apertures 104 could be utilized, one per standoff 200. The surface of each side of the motherboard 102 surrounding each aperture 104 is preferably plated with a conductive material which is electrically coupled by printed circuit board traces to a ground plane of the motherboard 102 or to a ground node of the motherboard 102. In addition, the apertures 104 are preferably round, having a standard-sized diameter of 4 mm, which is sized to accommodate industry standard 6-32 or M3 screws, a size commonly used with conventional, multiple-screw mounting methods. Using standard-sized apertures 104 allows a single motherboard 102 to be designed to be mounted according to conventional methods using multiple screws or mounted according to the invention using a minimum number of screws. Alternatively, the apertures 104 could be of any appropriate size or shape, such as slotted or keyhole.

The ramped portion 208 of each projecting member 202 is aligned to contact the surface of the motherboard 102 when the first projecting member 202 is inserted into the corresponding aperture 104 in the motherboard 102 (FIG. 3).

The shelf portion 207 of the first projecting member 202 prevents the standoffs 200 from being inserted too far into the apertures 104 in the motherboard 102. As will be explained in more detail, the ramped portion 208 and shelf 207 help secure the motherboard 102 to the standoffs 200 so that the motherboard 200 is substantially immobile in relation to the chassis.

Another expanded view of FIG. 1 shows the bracket assembly 300 in greater detail. The bracket assembly 300 is also shown in FIG. 5 attached to the motherboard 102. Referring to FIG. 1, the bracket assembly 300 includes a bracket 301, a screw plate 304, a second projecting member 302 and an optional tab 306 (FIG. 5). The bracket assembly 300 is preferably formed of sheet metal, but could be formed of any suitable material. Note that in FIG. 1, only a single projecting member 302 is shown. The bracket assembly 300, however, is also shown in FIG. 5. As can be seen from FIG. 5, there are several projecting members 302; it will be apparent that any number of projecting members 302 could be utilized.

The bracket assembly 300 is attached to the motherboard 102 by simultaneously inserting each of the projecting members 302 into corresponding apertures 105 in the motherboard 102. During assembly, the bracket assembly 300 stays attached to the motherboard 102 by one of two means. A first means is to replace one of the projecting members 302 with a screw and corresponding threaded hole in the bracket 300. A second means to secure the bracket assembly 300 to the motherboard 102 during assembly is to have a slight shape difference among the projecting members 302 and/or a slight misalignment of the projecting members 302 and apertures 105 so that some amount of force must be applied to insert the projecting members 302 into the apertures 105 of the motherboard 102 to conform the parts to each other.

The surface on each side of the motherboard 102 surrounding each of the apertures 105 is preferably plated with a conductive material which is electrically coupled by printed circuit board traces to a ground plane of the motherboard 102 or to a ground node of the motherboard 102. In addition, the apertures 105 are preferably round, having a standard-sized diameter of 4 mm, which is sized to accommodate 6-32 or M3 screws, a standard size used with conventional multiple-screw mounting methods. This allows a single motherboard 102 to be designed to be mounted according to conventional methods using multiple screws or mounted according to the invention using a minimum number of screws. Alternatively, the apertures 105 could be of any appropriate size or shape, such as slotted or keyhole.

The bracket 301 includes a shelf 305 which prevents the projecting members 302 of the bracket assembly 300 from being inserted too far into the apertures 105 of the motherboard 102. The point or bump 308 (FIG. 4) on shelf 305 makes solid electrical contact with the plated surface surrounding each aperture 105 of the motherboard 102. Once the projecting members 302 of the bracket assembly 300 have been installed into the apertures 105 of the motherboard 102, the bracket is aligned with the rear wall 101 of the chassis such that a threaded fastener or screw 303 may be inserted through a aperture in the rear wall 101 and into a corresponding threaded hole 305 (FIG. 5) in the screw plate 304 of the bracket assembly 300. The screw plate 304 may include a tab 306 to help maintain the alignment of the bracket assembly 300 to the rear wall 101, but the tab 306 is not required.

As the screw 303 is tightened, the bracket assembly 300 is drawn toward the rear wall 101. This causes the apertures 104 in the motherboard 102 to be pulled onto the ramped portion 208 of the indentation 206 of each standoff 200 which firmly engages the motherboard 102 to each standoff 200. Thus, the shelf 207 presses against a plated portion 106 (FIG. 3) of the bottom surface of the motherboard 102 and the ramped portion 208 presses against the plated portion 107 (FIG. 3) of the upper surface of the motherboard 102. Also, as the bracket assembly 300 draws the motherboard 102 toward the rear wall 101, this causes each standoff 200 to firmly engage the rectangular openings in the chassis base 100. Therefore, a solid, low impedance conductive path is established between the electrically conductive plating surrounding the apertures 104 and the computer system chassis. In addition, the motherboard 102 will be firmly held in a position substantially parallel to, and a fixed distance from, the chassis base 100 by the standoffs 200 and bracket assembly 300. The conductive path and firm positioning of the motherboard 102 is facilitated by the standoffs 200 having some resiliency, as this will accommodate any tolerances between each aperture 104, 105 and corresponding projecting member 202, 302.

The ramped portion 208 of each standoff 200 preferably forms an angle of approximately 20 to 35 degrees with respect to the upper surface of the motherboard 102. Otherwise, a substantially shallower angle could make the alignment of the motherboard 102 to the ramped portion 208 more difficult by increasing the effect of small tolerance differences; a substantially steeper angle could allow the motherboard 102 to be pulled off of the standoffs 200 too easily.

The projecting portions 202 of the standoffs 200 and the corresponding apertures 104 are preferably, but not necessarily, sized to provide a some space between the projecting portion 202 of the standoffs 200 and the interior of the apertures 104. This allows each projecting portion 202 to be easily inserted into the corresponding aperture 104. Also, the ramped portion 208 and/or the shelf 207 causes the motherboard 102 to properly align with the standoff 200 as the screw 303 is tightened without the motherboard 102 needing to be manually held in place as the screw is tightened.

Also, as the screw 303 is tightened, the projecting members 302 are cammed into the apertures 105 to firmly engage the motherboard 102. As the bracket assembly 300 is drawn toward the rear wall 101, the bracket assembly 300 is subject to a rotational force. This is due to the motherboard 102 pulling the upper portion of the bracket assembly 300, including the projecting members 302, toward the standoffs 200 and the screw 303 pulling the lower portion of the bracket assembly 300 in an opposite direction toward the rear wall 101. This rotational force, combined with the projecting members 302 having a shape such that the top portion of the projecting members 302 are curved or angled away from the rear wall 101, causes the projecting members to be firmly engaged to the apertures 105 of the motherboard 102. Preferably, but not necessarily, the projecting members 302 and corresponding apertures 105 are sized such that the projecting members 302 fit snugly in the apertures 105. This facilitates the firm engagement of the projecting members 302 to the apertures 105 under the rotational force. Alternatively, the projecting members 302 could be shaped such that the top portion curves toward the rear wall 101 such that the projecting members 302 of the bracket assembly 300 function similarly to the projecting members 202 of the standoffs 200.

Once the screw 303 is fully tightened, such that the screw plate 304 of the bracket assembly 300 contacts the rear wall 101, a low impedance conductive path is established between the bracket assembly 300 and the rear wall 101 of the chassis. The plating surrounding each aperture 105 makes firm contact with the points or bumps 308 (FIG. 4) of the bracket assembly 300. Therefore, a solid, low impedance conductive path is established between the electrically conductive plating surrounding the apertures 105 and the computer system chassis. In addition, the motherboard 102 will be firmly held in position by the bracket assembly 300 and the rear wall 101. The curved shape of the projecting members 302 prevents the motherboard 102 from lifting off the bracket assembly 300.

Therefore, the motherboard 102 will be firmly held in position with a solid low impedance conductive path to ground using only a single screw. It will be apparent that advantages of the present invention could be achieved by utilizing more than one screw to secure the bracket assembly 300 to the chassis. Also, any number of the projecting members 302 could be replaced by a threaded fastener 310 (FIG. 7) and a corresponding threaded opening in the bracket assembly 300 for attaching the motherboard 102 to the bracket assembly 300. In addition, it will be apparent that one or more additional screws may also be used to secure the motherboard 102 to conventional standoffs in the conventional manner.

FIG. 5 shows input and output connectors 402 which are optionally coupled to the motherboard 102. The input and output connectors 402 allow external devices, such as a monitor, a keyboard, a printer, a modem, or a network, to be coupled to circuits within the personal computer system. A plate 403 forms a gasket to seal any gaps or spaces between the input and output connectors 402 and the chassis of the computer system. Preferably, the plate 403 is electrically conductive. According to the invention, as the screw 303 is tightened, the motherboard 102 is drawn toward the chassis rear wall 101. Thus, according to another aspect of the invention, the input and output connectors 402 will also be drawn toward the rear wall 101 because they are coupled to the motherboard 102. When the screw 303 is fully engaged, the input and output connectors 402 press firmly against the plate 403, forcing the plate 403 into firm contact with the chassis rear wall 101 or into firm contact with a trim panel (not shown) coupled to the rear wall 101. This ensures a solid electrical connection between the plate 403, the chassis rear wall 101, and the input and output connectors 402, which improves the effectiveness and integrity of the electromagnetic shielding formed by the chassis and/or trim panels.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention. In particular, the screw 303 which secures the bracket 300 to the rear wall 101 of the chassis could instead secure the bracket assembly 300 to some other part of the chassis, such as a portion which is stamped and folded from, or attached to, the chassis base 100. Further, it will be apparent that the invention could be used to secure any printed circuit board to any type of system chassis. For example, the invention could be used to secure a printed circuit board oriented vertically to a wall of a mainframe computer chassis or housing.

What is claimed is:

1. A computer comprising:
   a. a chassis having a first surface and a second surface wherein the first surface is oriented at substantially a right angle relative to the second surface;
   b. means for attaching coupled to the first surface wherein the means for attaching comprises a first projecting member;
   c. a circuit board having a first aperture engaging the first projecting member by insertion of the first projecting member into the first aperture; and
   d. means for drawing the circuit board toward the second surface wherein the means for drawing is coupled to the circuit board and to the chassis and wherein the means for drawing pulls the circuit board toward the second surface and into firm engagement with the first projecting member.

2. The computer according to claim 1 wherein the means for drawing comprises:
   a. a first threaded fastener attaching the circuit board to a bracket; and
   b. a second threaded fastener drawing the bracket toward the second surface.

3. The computer according to claim 2 wherein the means for attaching comprises a resilient standoff formed from sheet metal wherein the resilient standoff comprises the first projecting member and wherein the first projecting member includes a ramped portion contacting the circuit board.

4. The computer according to claim 3 wherein the ramped portion forms an angle of between 20 and 35 degrees with respect to an upper surface of the circuit board.

5. The computer according to claim 1 wherein the means for drawing comprises:
   a. a second projecting member engaging a second aperture in the circuit board; and
   b. a threaded fastener coupled to the second projecting member and coupled to the second surface wherein the second projecting member is drawn toward the second surface by rotation of the threaded fastener.

6. The computer according to claim 5 wherein an electrical connector is coupled to the circuit board and a gasket is positioned between the electrical connector and an opening in the second surface to fill gaps between the opening in the second surface and the electrical connector wherein the means for drawing the circuit board toward the second surface forces the gasket into contact with the second surface.

7. The computer according to claim 5 wherein the second projecting member is inserted into the second aperture from a side of the circuit board and wherein the threaded fastener is positioned a predetermined distance from the side of the circuit board whereby rotation of the threaded fastener subjects the second projecting member to a rotational force relative to the circuit board which rotational force engages the second projecting member to the second aperture.

8. The computer according to claim 5 wherein the threaded fastener is the only threaded fastener required to secure the circuit board to the chassis.

9. The computer according to claim 1 wherein the circuit board is secured substantially parallel to the first surface and a predetermined distance from the first surface and wherein an electrical path is formed between a ground node of the circuit board and the chassis.

10. The computer according to claim 9 wherein a portion of a surface of the circuit board surrounding said first aperture is plated with an electrically conductive material.

11. The computer according to claim 9 wherein the first surface is formed of sheet metal and the means for attaching comprises a resilient standoff formed from the first surface.

12. The computer according to claim 9 wherein the means for attaching comprises a resilient standoff formed from sheet metal wherein the standoff snaps into a corresponding opening in the first surface.

13. The computer according to claim 12 wherein the resilient standoff comprises the first projecting member wherein the first projecting member includes a ramped portion contacting the circuit board.

14. The computer according to claim 13 wherein the ramped portion forms an angle of between 20 and 35 degrees with respect to an upper surface of the circuit board.

15. The computer according to claim 14 wherein the resilient standoff further comprises:
   a. a U-shaped base portion coupled to the first projecting member; and
   b. means for securing the standoff into the rectangular opening in the first surface wherein the means for securing is coupled to the U-shaped base portion.

16. A computer comprising:
   a. a chassis;
   b. first means for attaching coupled to the chassis wherein the first means or attaching comprises a first projecting member;
   c. second means for attaching coupled to the chassis wherein the second means for attaching comprises a second projecting member and wherein the second means for attaching includes means for drawing the second projecting member in a direction away from the first projecting member; and
   d. a circuit board having a first aperture engaging the first projecting member and having a second aperture engaging the second projecting member.

17. The computer according to claim 16 wherein an electrical connector is coupled to the circuit board and a gasket is positioned between the electrical connector and an opening in the chassis for filling gaps between the opening and the electrical connector wherein the means for drawing the second projecting member in a direction away from the first projecting member forcing the gasket into contact with the chassis.

18. The computer according to claim 16 wherein the circuit board is secured substantially parallel to a surface of the chassis and a predetermined distance from the surface and wherein an electrical path is formed between a ground node of the circuit board and the chassis.

19. The computer according to claim 16 wherein the second projecting member comprises a portion which is curved or angled toward the first projecting member.

20. The computer according to claim 19 wherein the means for drawing comprises:
   a. a bracket coupled to the second projecting member; and
   b. a single threaded fastener attaching the bracket to the chassis.

21. The computer according to claim 20 wherein the second projecting member enters the second aperture from a side of the circuit board and wherein the threaded fastener engages an opening in the bracket and is positioned a predetermined distance from the side of the circuit board.

22. The computer according to claim 16 wherein the first projecting member comprises an indentation located on a side of the first projecting member opposite the second projecting member wherein the indentation includes a ramped portion which forms an angle with respect to an upper surface of the circuit board.

23. The computer according to claim 22 wherein the angle is between 20 and 35 degrees.

24. The computer according to claim 22 wherein the first means for attaching comprises a resilient standoff formed from sheet metal wherein the standoff snaps into a corresponding opening in the chassis.

25. The computer according to claim 24 wherein the resilient standoff further comprises:
   c. a U-shaped base portion coupled to the first projecting member; and
   d. means for securing the standoff into the corresponding opening in the chassis wherein the means for securing is coupled to the U-shaped base portion.

26. A method of attaching a printed circuit board to a system chassis comprising the steps of:
   a. inserting a standoff formed of sheet metal into an opening in a chassis surface wherein the standoff comprises a first projecting member;
   b. inserting a second projecting member into a first aperture in a circuit board wherein the second projecting member is coupled to a bracket;
   c. inserting the first projecting member into a second aperture in the circuit board; and
   d. attaching the bracket to the chassis and drawing the second projecting member away from the first projecting member.

27. The method according to claim 26 wherein the threaded fastener is the only threaded fastener required to secure the circuit board to the chassis.

28. The method according to claim 27 wherein the circuit board is secured parallel to a surface of the chassis and a predetermined distance from the surface and wherein an electrical path is formed between a ground node of the circuit board and the chassis.

29. The method according to claim 28 wherein the first projecting member comprises an indentation wherein the indentation includes a ramped portion which forms an angle of between 20 and 35 degrees with respect to an upper surface of the circuit board.

30. A computer comprising:
   a. a chassis having a first surface and a second surface wherein the first surface is oriented at substantially a right angle relative to the second surface;
   b. means for attaching a circuit board to the fist surface wherein the means for attaching is coupled to the first surface comprises a first projecting member configured to pass through an aperture in the circuit board; and
   c. a threaded fastener coupled to the chassis and for coupling to the circuit board and for drawing the circuit board toward the second surface by rotation of the threaded fastener.

31. The computer according to claim 30 further comprising the circuit board wherein an electrical connector is coupled to the circuit board and a gasket is positioned between the electrical connector and an opening in the second surface to fill gaps between the opening in the second surface and the electrical connector and wherein the means for drawing the circuit board toward the second surface forces the gasket into contact with the second surface.

32. The computer according to claim 30 wherein the threaded fastener is the only threaded fastener required to secure the circuit board to the chassis.

33. The computer according to claim 30 further comprising the circuit board wherein the circuit board is secured substantially parallel to the first surface and a predetermined distance from the first surface and wherein an electrical path is formed between a ground node of the circuit board and the chassis.

34. The computer according to claim 30 wherein the means for attaching comprises a resilient standoff formed from sheet metal.

* * * * *

UNITED STATES PATENT AND TRADEMARK OFFICE
CERTIFICATE OF CORRECTION

PATENT NO. : 5,973,926  
DATED : Oct. 26, 1999  
INVENTOR(S) : Jim Sacherman, et al Page 1 of 3

It is certified that error appears in the above-identified patent and that said Letters Patent is hereby corrected as shown below:

In Column 3, line 35, please delete "Fig. 1" and insert --Fig. 1a-- before "shows a side view...."

In Column 3, line 36, please delete "an expanded side view of the", and replace with --a--.

In Column 3, line 38, please delete "an expanded side view of".

In Column 3, line 39, after the sentence ending with "a standoff.", please insert --Fig. 1b shows an enlarged side view of the mounting bracket assembly 300. Fig. 1c shows an enlarged view of the standoff 200.--

In Column 3, line 40, please delete "Fig. 3" and insert --Fig. 3a-- before "shows a side view...."

In Column 3, line 42, after the sentence ending with "the motherboard.", please insert --Fig. 3b shows the standoff 200 in contact with the motherboard 102.--

In Column 3, line 48, please cancel the previous insertion added by Applicants' Amendment dated December 18, 1997. Specifically, please delete the following text:

"Fig. 6 illustrates a standoff integrally formed with the chassis.

Fig. 7 illustrates a threaded fastener which can replace a projecting member of the bracket illustrated in Fig. 1."

which was previously added by amendment to page 5, line 24, and replace it with the following text:

--Fig. 6 illustrates a standoff integrally formed with the chassis.

Fig. 7 illustrates a threaded fastener which can replace a projecting member of the bracket illustrated in Figs. 1a and 1b.--

UNITED STATES PATENT AND TRADEMARK OFFICE
CERTIFICATE OF CORRECTION

PATENT NO. : 5,973,926
DATED : Oct. 26, 1999
INVENTOR(S) : Jim Sacherman, et al

It is certified that error appears in the above-identified patent and that said Letters Patent is hereby corrected as shown below:

In Column 3, line 55, please delete "Fig. 1" and insert --Fig. 1a-- before "shows a side view...."

In Column 3, line 56, please delete "motherboard 102 including an expanded" and replace with --motherboard 102. Fig. 1b shows an enlarged--.

In Column 3, line 57, please insert a period --.-- after "bracket assembly 300".

In Column 3, line 57, please delete "and an expanded" and replace with --Fig. 1c shows an enlarged--.

In Column 4, line 11, please delete "An expanded portion of Fig. 1" and replace with --The enlarged view of Fig. 1c--.

In Column 4, line 13, please delete "Fig. 3" and replace with --Fig. 3a--.

In Column 4, line 14, please replace with --Fig. 3b shows a partial side view of the standoff 200 attached to a motherboard 102.-- between "a standoff 200." and "Each standoff...."

In Column 4, line 46, please delete "Fig. 1," and replace with --Fig. 1c,--.

In Column 4, line 67, please delete "(Fig. 3)." and replace with --(Fig. 3b).--.

In Column 5, line 8, please delete "Another expanded view of Fig. 1" and replace with --The enlarged partial view of Fig. 1b--.

UNITED STATES PATENT AND TRADEMARK OFFICE
CERTIFICATE OF CORRECTION

PATENT NO.  : 5,973,926
DATED       : Oct. 26, 1999
INVENTOR(S) : Jim Sacherman, et al It is certified that error appears in the above-identified patent and that said Letters Patent is hereby corrected as shown below:

In Column 5, line 11, please delete "Fig. 1," and replace with --Fig. 1b,--.
In Column 5, line 15, please delete "Fig. 1," and replace with --Figs. 1a and 1c,--.
In Column 6, line 5, please delete "(Fig. 3)" and replace with --(Fig. 3b)--.
In Column 6, line 7, please delete "(Fig. 3)" and replace with --(Fig. 3b)--.
In Column 6, line 33, please delete "some".

Signed and Sealed this

Fifteenth Day of August, 2000

Attest:

Q. TODD DICKINSON

Attesting Officer        Director of Patents and Trademarks